United States Patent [19]
Patel et al.

[11] Patent Number: 5,108,858
[45] Date of Patent: Apr. 28, 1992

[54] METHOD FOR MAKING A VIEWING SCREEN STRUCTURE FOR CRT

[75] Inventors: Himanshu M. Patel, Rome; Antimo Pezzulo, Anagni, both of Italy

[73] Assignee: Videocolor, Anagni, Italy

[21] Appl. No.: 565,827

[22] Filed: Aug. 13, 1990

[30] Foreign Application Priority Data

Apr. 12, 1990 [IT] Italy .................. 20031 A/90

[51] Int. Cl.$^5$ .............................. 603C 5/00
[52] U.S. Cl. .................. 430/25; 430/23, 28, 29, 329
[58] Field of Search .................. 430/23, 25, 28, 29, 430/329

[56] References Cited

FOREIGN PATENT DOCUMENTS

| | | | |
|---|---|---|---|
| 42704 | 12/1981 | European Pat. Off. | 430/28 |
| 2829878 | 1/1980 | Fed. Rep. of Germany | 430/28 |
| 2834688 | 2/1980 | Fed. Rep. of Germany | 430/23 |
| 15246 | 1/1984 | Japan | 430/28 |

Primary Examiner—Hoa Van Le
Attorney, Agent, or Firm—Joseph S. Tripoli; Dennis H. Irlbeck; Vincent J. Coughlin, Jr.

[57] ABSTRACT

The present invention relates to a method for making a viewing screen structure for a cathode-ray tube. The method includes the steps of coating a support surface with a film of a polymeric material, a suitable dichromate and a sensitizer therefor which is a chromium ion migration enhancer having a reduced sensitivity to thermal and dark hardening; exposing the film to an image in the form of radiant energy until the solubility of the irradiated regions thereof is selectively altered, thereby producing in the film regions of greater solubility and regions of lesser solubility; removing those regions of the film with greater solubility to bare portions of the underlying support surface while retaining those regions of the film with lesser solubility. The bare portions of the support surface and the retained film regions are overcoated with a composition of light-absorbing material which is adherent to the support surface. A solution of an oxidant is applied to the light absorbing material to selectively dissolve the retained film regions. The dissolved retained film regions and the light-absorbing material thereon are flushed-away leaving the light-absorbing material adhering to the support surface. Following the above-described steps, a luminescent screen is formed by depositing phosphor materials on areas of the support surface previously occupied by the retained film regions.

17 Claims, No Drawings

METHOD FOR MAKING A VIEWING SCREEN STRUCTURE FOR CRT

This invention relates to a novel method for making a viewing screen structure for a cathode-ray tube (CRT) and, more particularly, but not exclusively, to a method for making a light-absorbing matrix for a color television picture tube.

BACKGROUND OF THE INVENTION

U.S. Pat. No. 4,049,452, issued to Nekut on Sep. 20, 1977, discloses a method for producing a screen structure employing a photoresist consisting of at least one diol ether or diol alkane and a polymeric material the solubility of which in a solvent is altered when it is exposed to light. The resist is coated on a support surface to form a film which is then exposed to an image in the form of light to selectively alter the solubility of the irradiated regions thereof. The more soluble regions of the film are removed, baring areas of the support surface, and a light-absorbing coating is deposited on the bare areas of the support surface and on the retained, less soluble, film regions. Then, a suitable etchant is applied to remove the retained film regions and the light-absorbing coating thereon, while retaining the light-absorbing coating on the support surface, thus forming openings, or windows, and creating the light-absorbing matrix.

The glycols and alcohols disclosed in the above-referenced patent, as well as other commonly used polar additives with hydroxyl functionality that are added to the polymeric material to form the resist solution, are highly sensitive to thermal and dark reactions and thus to the temperature of the support surface and the film drying process. While high sensitivity of the resist solution to light is desirable, a high sensitivity to heat or susceptibility to chemical reaction is undesirable since it causes non-uniformity in the resist film and variations in removal of the retained film regions, resulting in a reduction in sharpness, or edge definition, of the windows formed in the light-absorbing matrix.

The problem to which the present invention is directed is that of providing a photosensitive resist composition for the production of luminescent screen structures with a light-absorbing matrix for a color television picture tube, which composition maintains high sensitivity to light but substantially reduced "dark" hardening and thermal sensitivity.

SUMMARY OF THE INVENTION

The present invention relates to a method for making a luminescent viewing screen structure for a cathode-ray tube. The method includes the steps of coating a support surface with a film of a polymeric material, a suitable dichromate and a sensitizer therefor which is a chromium ion migration enhancer having a reduced sensitivity to thermal and dark hardening; exposing the film to an image in the form of radiant energy until the solubility of the irradiated regions thereof is selectively altered, thereby producing in the film regions of greater solubility and regions of lesser solubility; removing those regions of the film with greater solubility to bare portions of the underlying support surface while retaining those regions of the film with lesser solubility. The bare portions of the support surface and the retained film regions are overcoated with a composition of light-absorbing material which is adherent to the support surface. A solution of an oxidant is applied to the light-absorbing material to selectively dissolve the retained film regions. The dissolved retained film regions and the light-absorbing material thereon are flushed-away leaving the light-absorbing material adhering to the support surface.

DETAILED DESCRIPTION OF THE INVENTION

Generally, the details of the novel method are similar to those of the method described in U.S. Pat. No. 4,049,452, except for the film formulation and the oxidant used to develop the film.

The film is a photosensitive resist comprising a polymeric material, a soluble dichromate and a chromium ion migration enhancer. The film is prepared by applying to the inner support surface of a glass faceplate of a cathode-ray tube a quantity of an aqueous solution preferably comprised of about 2.0 weight percent polyvinyl alcohol (pva); about 0.06 to 0.40, but, preferably about 0.2 weight percent sodium or potassium dichromate (which provides a ratio of dichromate to pva within the range of 0.03 to 0.20, with a preferred ratio of 0.1); about 0.1 to 4.0, but, preferably about 1.3 weight percent of a dichromate sensitizer, such as N-methyl-2-pyrolidone, 2-pyrolidone or N-ethyl-2-pyrolidone (which provides a ratio of pyrolidone to pva within the range of 0.05 to 2.0, with a preferred ratio of about 0.65); about 1.0 weight percent of an acrylic copolymer such as Rhoplex AC73, marketed by Rohm and Haas Chemical Co., Philadelphia, Pa.; about 0.036 weight percent of a suitable wetting agent; and the balance deionized water.

The pyrolidones are chromium ion enhancers which reduce the exposure time of the film, in a manner similar to that of the diol ethers and diol alkanes disclosed in U.S. Pat. No. 4,049,452. However, unlike diol ethers and diol alkanes, the pyrolidones are sufficiently polar to allow $Cr^{3+}$ stabilization, but do not coordinate sufficiently strongly with the chromium ion to cause enhanced "dark" hardening, i.e., hardening due to a chemical reaction. Additionally, the pyrolidones demonstrate reduced thermal sensitivity while maintaining high sensitivity to light.

An example of the novel method for preparing a light-absorbing matrix on the inner surface of a faceplate of an aperture-mask-type color television picture tube will now be described. First, the inner surface of the faceplate for the tube is cleaned in the usual way as with water, ammonium bifluoride, hydrofluoric acid, detergent, caustic, etc., to remove any foreign matter. Then, the surface is coated with a film of a photosensitive polymeric material containing an amount of a pyrolidone. The film may be produced by depositing on the surface of the faceplate a quantity of an aqueous solution containing about:

| Ingredient | Weight Percent |
| --- | --- |
| Polyvinyl Alcohol (pva) | 2.0 |
| N-methyl-2-pyrolidone | 1.3 |
| Sodium dichromate | 0.2 |
| Acrylic copolymer, such as Rhoplex AC73 | 1.0 |
| Wetting agent | 0.036 |
| Water | balance to 100 |

The faceplate is rotated and tilted so that the solution spreads evenly over the surface. During the latter steps of rotation, infrared heat and air are applied so that the water in the solution evaporates and a dry film is formed on the surface.

An aperture mask for the tube is positioned above the film and the assembly is placed on a conventional lighthouse, which is an apparatus designed to expose the film on the faceplate by projecting light through the apertures in the mask.

During the exposure, light from the lighthouse lamp is projected through the mask causing rays of light to pass through the apertures of the mask and strike the film. The irradiated regions of the film harden; that is, become insoluble in water. The exposure through the mask is performed three times, each time with the light incident at a slightly different angle so that the light rays harden the film in groups of three or triads, as in the usual shadow mask-screen manufacturing procedure.

Following exposure, the assembly is removed from the lighthouse and the mask separated from the faceplate. The exposed coating is subjected to flushing with a forced spray of water for about 30 seconds to remove those regions of the film with greater solubility to bare portions of the underlying support surface. The faceplate is then rinsed with water and dried. At this point in the process, the faceplate surface carries an adherent stencil comprised of open or bare regions and retained regions of hardened polymeric film coated on the support surface. The stencil is now overcoated with a composition comprised of light-absorbing particles. In this example, the overcoating is produced by applying to the stencil a slurry containing about 4.0 to 8.0 weight percent of colloidal graphite in water and then drying the overcoating, as by applying infrared heat and air for about 1.5 minutes. After cooling, the overcoating is well adhered both to the retained film regions and to the bare faceplate surface.

Next, an oxidant for the retained film regions is applied to the overcoating. In this example, the oxidant is an aqueous solution containing about 0.01 to 0.10, but, preferably 0.01 to 0.05 weight percent of periodic acid ($HIO_4.2H_2O$). This solution may be applied to the overcoating as a wash or as a spray under pressure. The periodic acid solution penetrates the overcoating and the retained film regions, causing the hardened polyvinyl alcohol chain to decompose or dissolve. Subsequent flushing with water removes the dissolved film together with the overlying portion of the overcoating, but leaves behind that portion of the overcoating which is adhered directly to the support surface of the faceplate. At this point, the faceplate carries a black light-absorbing matrix having a multiplicity of openings therethrough.

The black, light-absorbing matrix is now rinsed with water and dried for about 4 minutes with the aid of infrared heat. Then, the faceplate is processed in the usual way to deposit red-emitting, green-emitting and blue-emitting phosphor stripes or dots over the openings in the matrix previously occupied by the retained film regions.

GENERAL CONSIDERATIONS

A matrix made in accordance with the above has greater uniformity than a prior matrix, because of the improved flow characteristics of the photoresist solution attributable to the enhancement of chromium ion migration caused by the N-methyl-2-pyrolidone. Additionally, the use of the very low concentration of periodic acid provides an improvement in matrix window edge definition by fully dissolving the retained film regions without overetching the light-absorbing material attached to the support surface. More importantly, however, is the increase in processing latitude provided by the novel coating solution containing N-methyl-2-pyrolidone. Not only is the novel formulation highly sensitive to light but it is less thermally sensitive and more resistant to dark hardening than prior formulations, so that incoming panel temperatures can now vary within a range in excess of 30° C., whereas prior coating formulations required more stringent control of panel temperatures, e.g., within a range of 10° C., in order to provide satisfactory matrix uniformity.

What is claimed is:

1. A method for making a viewing screen structure for a cathode-ray tube, the steps comprising,
   a) coating a support surface with a film of a polymeric material, a suitable dichromate and a sensitizer therefor which is a chromium ion migration enhancer having a reduced sensitivity to thermal and dark hardening,
   b) exposing said film to an image in the form of radiant energy until the solubility of the irradiated regions thereof is selectively altered, thereby producing in said film regions of greater solubility and regions of lesser solubility,
   c) removing those regions of said film with greater solubility to bare portions of the underlying support surface while retaining those regions of said film with lesser solubility,
   d) overcoating said bare portions of said support surface and said retained film regions with a composition of light-absorbing material which is adherent to said support surface,
   e) applying a solution of an oxidant to said light-absorbing material to selectively dissolve said retained film regions, and
   f) developing by flushing-away said dissolved retained film regions and the light-absorbing material thereon, while retaining said light-absorbing material adhering to said support surface.

2. The method as described in claim 1, wherein said sensitizer is selected from the group consisting of 2-pyrolidone, N-methyl-2-pyrolidone and N-ethyl-2-pyrolidone.

3. The method as described in claim 2, wherein the concentration of polyvinyl alcohol (pva) in said film is about 2 weight percent.

4. The method as described in claim 3, wherein the ratio of sensitizer to pva is within the range of 0.05 to 2.0.

5. The method as described in claim 4, wherein the ratio of sensitizer to pva is about 0.65.

6. The method as described in claim 3, wherein the ratio of dichromate to pva is within the range of 0.03 to 0.20.

7. The method as described in claim 6, wherein the ratio of dichromate to pva is about 0.1.

8. The method as described in claim 1, wherein said oxidant comprises an aqueous solution of periodic acid having a concentration within the range of 0.01 to 0.10 weight percent.

9. The method as described in claim 8, wherein the concentration of said aqueous solution of periodic acid is within the range of 0.01 to 0.05 weight percent.

10. A method for making a luminescent viewing screen structure for a cathode-ray tube, the steps comprising, a) coating a support surface of a faceplate panel with a film of pva, a suitable dichromate and a sensitizer therefor which is a chromium ion migration enhancer selected from the group consisting of 2-pyrolidone, N-methyl-2-pyrolidone and N-ethyl-2-pyrolidone, b) exposing said film to an image in the form of radiant energy until the solubility of the irradiated regions thereof is selectively altered, thereby producing in said film regions of greater solubility and regions of lesser solubility, c) removing those regions of said film with greater solubility to bare portions of the underlying support surface while retaining those regions of said film with lesser solubility, d) overcoating said bare portions of said support surface and said retained film regions with a composition of light-absorbing material which is adherent to said support surface, e) applying an aqueous solution of periodic acid to said light-absorbing material to selectively dissolve said retained film regions, f) developing by flushing-away said dissolved retained film regions and the light absorbing material thereon, while retaining said light-absorbing material adhering to said support surface, and g) then depositing phosphor material on areas of the support surface previously occupied by said retained film regions.

11. The method as described in claim 10, wherein the concentration of pva in said film is about 2 weight percent.

12. The method as described in claim 11, wherein the ratio of sensitizer to pva is within the range of 0.05 to 2.0.

13. The method as described in claim 12, wherein the ratio of sensitizer to pva is about 0.65.

14. The method as described in claim 11, wherein the ratio of dichromate to pva is within the range of 0.03 to 0.20.

15. The method as described in claim 14, wherein the ratio of dichromate to pva is about 0.1.

16. The method as described in claim 10, wherein the concentration of said aqueous solution of periodic acid is within the range of 0.01 to 0.10 weight percent.

17. The method as described in claim 16, wherein the concentration of said aqueous solution of periodic acid is within the range of 0.01 to 0.05 weight percent.

* * * * *